United States Patent [19]

Seoka et al.

[11] 3,936,429
[45] Feb. 3, 1976

[54] REACTIVE POLYMER

[75] Inventors: Yoshio Seoka; Masato Satomura; Akira Umehara, all of Asaka, Japan

[73] Assignee: Fuji Photo Film Co., Ltd., Minami-ashigara, Japan

[22] Filed: Jan. 29, 1974

[21] Appl. No.: 437,564

[30] Foreign Application Priority Data
Jan. 30, 1973 Japan.............................. 48-12298
Feb. 26, 1973 Japan.............................. 48-23436

[52] U.S. Cl............... 260/79.3 M; 96/67; 96/114; 260/79.3 R; 260/80.3 R; 260/80.72; 260/87.5 E
[51] Int. Cl.² ................... C08F 28/00; C08G 75/22; G03C 1/76
[58] Field of Search ....... 260/80.72, 80.3 R, 87.5 E, 260/79.3 R, 79.3 M; 96/67, 114

[56] References Cited
UNITED STATES PATENTS

| | | | |
|---|---|---|---|
| 2,656,271 | 10/1953 | Neugebauer et al..................... | 96/49 |
| 2,721,852 | 10/1955 | Fowler et al...................... | 260/80.72 |
| 2,828,270 | 3/1958 | Murata............................. | 260/80.72 |
| 2,972,535 | 2/1961 | Laakso et al................... | 260/80.3 R |
| 3,087,907 | 4/1963 | Brucksch.......................... | 260/80.72 |
| 3,574,128 | 4/1971 | King................................... | 96/90 PC |
| 3,642,728 | 2/1972 | Canter ....................... | 260/79.3 R |
| 3,642,953 | 2/1972 | O'Neill et al................... | 260/79.3 R |
| 3,730,734 | 5/1973 | Delzenne ........................... | 96/90 PC |
| 3,754,055 | 8/1973 | Rembaum...................... | 260/80.72 |
| 3,784,399 | 1/1974 | Grot................................ | 260/79.3 M |

*Primary Examiner*—Ronald W. Griffin
*Attorney, Agent, or Firm*—Sughrue, Rothwell, Mion, Zinn & Macpeak

[57] ABSTRACT

A quaternary salt-type reactive polymer composition comprising therein repeating monomer units represented by the following general formula

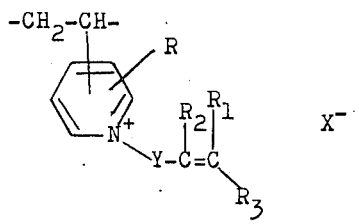

wherein R represents a hydrogen atom or an alkyl group having 1 to 4 carbon atoms; $R_1$ represents a hydrogen atom, an alkyl group having 1 to 6 carbon atoms, an alkoxycarbonyl group, having 2 to 8 carbon atoms an aryl group, a carbamoyl group having 1 to 8 carbon atoms, a carboxy group, or an acyl group having 1 to 8 carbon atoms; $R_2$ represents a hydrogen atom, a methyl group or a cyano group; $R_3$ represents a hydrogen atom, a carbamoyl group having 1 to 8 carbon atoms, a nitro group, a cyano group, an alkoxy group having 1 to 3 carbon atoms or an alkoxy carbonyl group having 2 to 8 carbon atoms; Y represents a divalent radical having 1 to 12 carbon atoms; and $X^-$ represents a halogen atom, such as Br, Cl or I, an alkanesulfonyloxy group having 1 to 4 carbon atoms, an alkanesulfonyloxy group having 1 to 4 carbon atoms a styrenesulfonyloxy group, or an arylsulfonyloxy group having 6 to 10 carbon atoms. A preferred -Y- moiety is

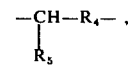

wherein $R_4$ represents

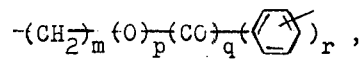

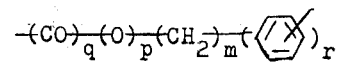

or 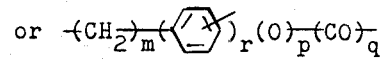

wherein $m$ is 0, 1, 2, or 3; $p$, $q$ and $r$ is 0 or 1; $R_5$ represents a hydrogen atom or a methyl group.

The quaternary salt-type functional polymer described above can be synthesized by reacting (1) a vinylpyridine with a halide or a sulfonic ester compound containing at least one unsaturated group or (2), a vinyl pyridine unit containing polymer with a halide or a sulfonic ester compound containing at least one unsaturated group, and processes for the preparation thereof.

22 Claims, No Drawings

REACTIVE POLYMER

BACKGROUND OF THE INVENTION

1. Field of the Invention

The present invention relates to a reactive polymer having a novel skeletal structure, which undergoes a reduction in solubility or becomes insoluble due to the action of light, heat or electron beams.

2. Description of the Prior Art

Heretofore, detailed descriptions of light-sensitive polymers which undergo a reduction in solubility in a solvent or become insoluble in solvents due to the action of light or electron beam are given in the literature (for example, J. Kosar; *Light-Sensitive Systems*, John Wiley and Sons, New York (1965), Tsunoda; *Kankousei Jushi* (*Photosensitive Resin*), Publishing Department of Insatsugakkai (1972), etc.).

These light-sensitive polymers are used for printing plates, photoresists, paints, adhesives, etc.

In the case of forming, particularly, images using a reactive polymer, generally development-processing is required. For such development, organic solvents are commonly used as the developing agent. However, organic solvents can be the cause of environmental pollution or public, hazards due to their well known high inflammability, bad odor, and toxicity. Therefore, an aqueous solvent system, particularly, water alone, would have great advantages as the developing agent from the standpoint of inflammability, toxicity or cost of the processing solution. Thus, the development of a reactive composition which can be processed with an aqueous system has long been sought.

An object of the present invention is to provide a reactive composition which can be development-processed with an aqueous system. This object has been attained using a quaternary salt-type polymer as the reactive polymer.

In general, two processes to obtain the above-described light-sensitive polymer are presently known: one being (a) a process wherein a monomer having a reactive group is first synthesized and then the resulting monomer is polymerized to obtain a reactive polymer and the other being (b) a process wherein a polymer is first synthesized and then a reactive group is introduced into the resulting polymer utilizing a high polymer reaction. The former process (a) can provide a polymer having a comparatively high reactivity, while the latter process (b) has the defect that a high polymer compound having the reactive group in a proportion of 100% is difficult to obtain since this process utilizes the high polymer reaction. On the other hand, however, the latter process (b) has the advantage that it enables the end product to be produced at low cost since the reaction procedure is compparatively simple. In the present invention, a polymer produced according to an absolutely unique process, as well as those produced according to the above-described two processes, are used. It is needless to say that the polymer produced by the unique process of the invention possesses the advantages of the above-described two synthetic processes, i.e., that the reactive group is connected to the polymer in a proportion of 100% and that the polymer can be produced with ease since the reaction conditions are mild and the reaction procedures are simple. Therefore, this unique synthetic process will surely contribute to the field of synthesizing the reactive polymer. That is, the composition containing the reactive polymer is of great significance.

Quaternary salt-type polymers have long been utilized as ion-exchange resins, dye-retaining agents, high molecular weight germicides, conductive coating materials, etc. These are described in detail in general in, for example, M. F. Hoover; "Cationic Quaternary Polyelectrolytes-Literature Review", *J. Macromol. Sci.*, A4, pp.1327 – 1417 (1970). However, no reports on quaternary salt-type polymers having an unsaturated group as used in the present invention are known. V. A. Kabanov, et al have merely reported in *J. Polym. Sci.*, C16, pp.1079 – 1094 (1967) that, when 4-vinylpyridine is reacted with an alkyl halide in various organic media, a high molecular weight quaternary salt-type polymer is produced instead of a quaternary salt-type monomer.

SUMMARY OF THE INVENTION

A quaternary salt-type reactive polymer composition comprising therein repeating monomer units represented by the following general formula

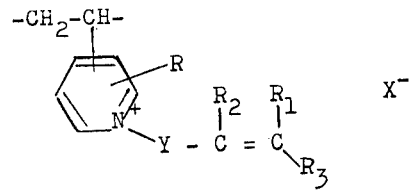

wherein R represents a hydrogen atom or an alkyl group having 1 to 4 carbon atoms; $R_1$ represents a hydrogen atom, an alkyl group having 1 to 6 carbon atoms, an alkoxycarbonyl group having 2 to 8 carbon atoms, an aryl group, a carbamoyl group having 1 to 8 carbon atoms, a carboxy group, or an acyl group having 1 to 8 carbon atoms; $R_2$ represents a hydrogen atom, a methyl group or a cyano group; $R_3$ represents a hydrogen atom, a carbamoyl group having 1 to 8 carbon atoms, a nitro group, a cyano group, an alkoxy group having 1 to 3 carbon atoms or an alkoxy carbonyl group having 2 to 8 carbon atoms; Y represents a divalent radical having 1 to 12 carbon atoms; and $X^-$ represents a halogen atom, such as Br, Cl or I, an alkylsulfonyloxy group having 1 to 4 carbon atoms, an alkanesulfonyloxy group having 1 to 4 carbon atoms a styrenesulfonyloxy group, or an arylsulfonyloxy group having 6 to 10 carbon atoms. A preferred -Y- moiety is

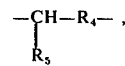

wherein $R_4$ represents

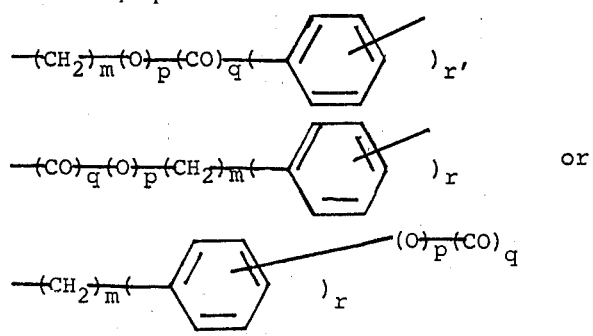

or wherein m is 0, 1, 2, or 3; p, q and r is 0 or 1; $R_5$ represents a hydrogen atom or a methyl group.

The quaternary salt-type functional polymer described above can be synthesized by reacting (1) a vinylpyridine with a halide or a sulfonic ester compound containing at least one unsaturated group or (2), a vinyl pyridine unit containing polymer with a halide or a sulfonic ester compound containing at least one unsaturated group.

DETAILED DESCRIPTION OF THE INVENTION

It has now also been found that the quaternary salt-type reactive polymer of the present invention (III) described above can be synthesized (1) by reacting a vinylpyridine (I) with a halide or a sulfonic ester having an unsaturated group (II) according to, e.g., the following reaction schematic;

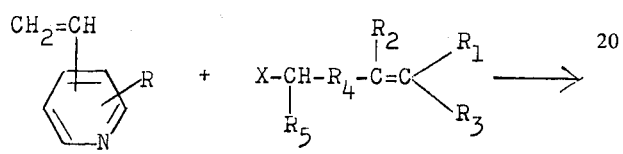

(I)          (II)

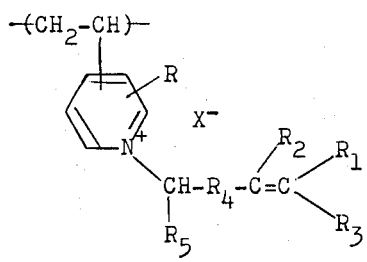

(III)

wherein R, $R_1$, $R_2$, $R_3$, $R_4$, $R_5$ and X are as above described.

Another process (2) for synthesizing the quaternary salt-type reactive polymer of the present invention (III) is to react an unsaturated compound (II) with a polymer having vinyl pyridine units therein (IV) to convert the polymer to the quaternary salt-type. That is, the quaternary salt-type polymer can be synthesized according to a Menshutkin reaction by reacting the polymer having therein repeating units (IV) with an unsaturated compound represented by the above described general formula (II) in accordance with the following reaction schematic;

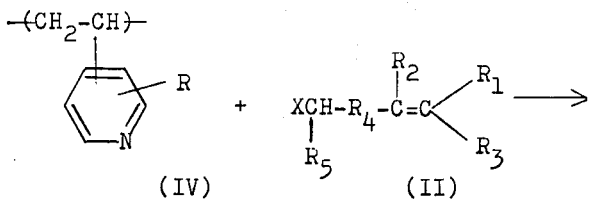

(IV)         (II)

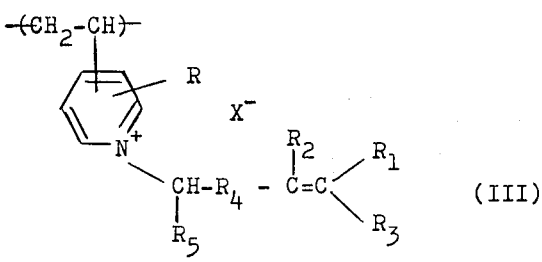

(III)

wherein R, $R_1$, $R_2$, $R_3$, $R_4$, $R_5$, X, are as above described. Preferred examples of Compound (II) are

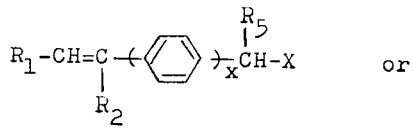

or

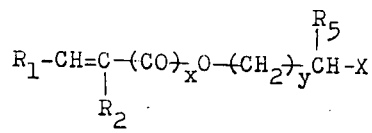

wherein R, $R_1$, $R_2$, $R_3$, $R_4$, $R_5$ and X, are the same as defined above and x is 0 or 1 and y is 1, 2 or 3 and suitably compound (II) is

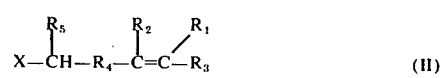          (II)

wherein R represents a hydrogen atom or an alkyl group having 1 to 4 carbon atoms; $R_1$ represents a hydrogen atom, an alkyl group having 1 to 6 carbon atoms, an alkoxycarbonyl group having 2 to 8 carbon atoms, an aryl group, a carbamoyl group having 1 to 8 carbon atoms, a carboxy group or an acyl group having 1 to 8 carbon atoms; $R_2$ represents a hydrogen atom, a methyl group or a cyanogroup; $R_3$ represents a hydrogen atom, a carbamoyl group having 1 to 8 carbon atoms, a nitro group, a cyano group, an alkoxy group having 1 to 3 carbon atoms or an alkoxycarbonyl group having 2 to 8 carbon atoms; $R_4$ represents

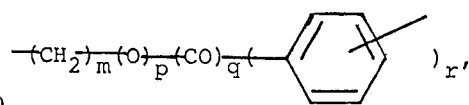

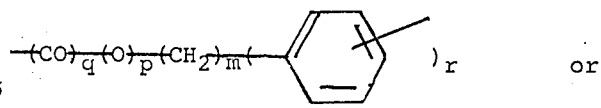   or

wherein m is 0, 1, 2, or 3; p, q and r is 0 or 1; $R_5$ represents a hydrogen atom or a methyl group; and X represents a halogen atom such as Cl, Br, I, an alkylsulfonyloxy having 1 to 4 carbon atoms, an alkanesulfonyloxy group having 1 to 4 carbon atoms, a styrenesulfonyloxy group, or an arylsulfonyloxy group having 6 to 10 carbon atoms.

Suitable examples of alkyl groups having 1 to 6 carbon atoms are methyl, ethyl, propyl, butyl and hexyl groups, of alkoxycarbonyl groups having 2 to 8 carbon atoms are methoxycarbonyl, ethoxycarbonyl, and benzyloxycarbonyl groups, of aryl groups are phenyl, tolyl, nitrophenyl, chlorophenyl, allylphenyl and dinitrophenyl groups, of carbamoyl groups having 1 to 8 carbon atoms are methylcarbamoyl, ethylcarbamoyl and butylcarbamoyl groups, of acyl groups having 1 to 8 carbon atoms are acetyl, formyl, benzyl, propionyl, nitrobenzoyl, chlorobenzoyl, octanoyl, thenoyl and furoyl groups, of arylsulfonyloxy groups are benzenesulfonyloxy and toluenesulfonyloxy group, of alkylsulfonyloxy groups are methylsulfonyloxy, ethylsulfonyloxy groups, of alkanesulfonyloxy groups are vinylsulfonyl groups, and of alkoxy groups having 1 to 3 carbon atoms are methoxy, ethoxy and propoxy groups.

As the vinylpyridines (I) which can be used as the starting material, pyridines having a vinyl group are advantageously used. Specific examples thereof include 2-vinylpyridine, 3-vinylpyridine, 4-vinylpyridine, vinylmethylpyridine, vinylbutylpyridine, vinyldimethylpyridine, and the like. It is to be understood that the pyridines also include the quinolines, acridines, etc., such as 4-vinylquinoline, 2-vinylquinoline, 4-vinyl-2-methylquinoline, 6-vinylphenanthridine, and 9-vinylacridine.

Suitable polymer compounds having the repreating unit (IV), are homopolymers or copolymers of the above-described vinylpyridines. Suitable comonomers which can be copolymerized therewith are monomers having 2 to 16, preferably 2 to 9, carbon atoms. Example of such comonomers are, e.g., acrylic esters, acrylamides, methacrylic esters, methacrylamides, allyl compounds, vinyl ethers, vinyl esters, N-vinyl compounds, styrenes, crotonic acid esters, and the like. Specific examples thereof include acrylates such as acrylic acid, an alkyl acrylate (e.g., propyl acrylate, butyl acrylate, amyl acrylate, ethylhexyl acrylate, octyl acrylate, t-octyl acrylate, chloroethyl acrylate, hydroxyethyl acrylate, hydroxypropyl acrylate, 2,2-dimethylhydroxypropyl acrylate, 5-hydroxypentyl acrylate, diethyleneglycol monoacrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, etc.), an aryl acrylate (e.g., phenyl acrylate, etc.); methacrylates such as methacrylic acid, an alkyl methacrylate (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, N-ethyl-N-phenylaminoethyl methacrylate, ethyleneglycol monomethacrylate, 2-hydroxyethyl methacrylate, 3-hydroxypropyl methacrylate, 2-hydroxypropyl methacrylate, 4-hydroxybutyl methacrylate, 5-hydroxypentyl methacrylate, 2,2-dimethyl-3-hydroxypropyl methacrylate, diethyleneglycol monomethacrylate, trimethylolpropane monomethacrylate, pentaerythritol monomethacrylate, glycidyl methacrylate, furfuryl methacrylate, tetrahydrofurfuryl, methacrylate, etc.), an aryl methacrylate (e.g., phenyl methacrylate, cresyl methacrylate, naphthyl methacrylate, etc.), etc.; acrylamides such as acrylamide, an N-alkyl acrylamide (the alkyl moiety being, e.g., a methyl group, an ethyl group, a propyl group, a butyl group, a t-butyl group, a heptyl group, an octyl group, a cyclohexyl group, a benzyl group, a hydroxymethyl group, a hydroxyethyl group, a benzyl group, etc.), an N-aryl acrylamide (the aryl moiety being, e.g., a phenyl group, a tolyl group, a nitrophenyl group, a naphthyl group, a hydroxyphenyl group, etc.), an N,N-dialkyl acrylamide (the alkyl moiety being, e.g., a methyl group, an ethyl group, a butyl group, an isobutyl group, an ethylhexyl group, a cyclohexyl group, etc.), N-methyl-N-phenylacrylamide, N-hydroxyethyl-N-methylacrylamide, N-2-acetamidoethyl-N-acetylacrylamide, etc.; methacrylamides such as methacrylamide, an N-alkylmethacrylamide (the alkyl moiety being, e.g., a methyl group, an ethyl group, a t-butyl group, an ethylhexyl group, a hydroxyethyl group, a cyclohexyl group, etc.), an N-arylmethacrylamide (the aryl moiety being, e.g., a phenyl group, etc.), an N,N-dialkylmethacrylamide (the alkyl moiety being, e.g., an ethyl group, a propyl group, a butyl group, etc.), N-hydroxyethyl-N-methylmethacrylamide, N-methyl-N-phenylmethacrylamide, N-ethyl-N-phenylmethacrylamide, etc.; allyl compounds such as allyl alcohol, allylsulfonic acid or an allyl ester (e.g., allyl acetate, allyl caproate, allyl caprylate, allyl laurate, allyl palmitate, allyl stearate, allyl benzoate, allyl acetoacetate, allyl lactate, etc.), allyloxyethanol, etc.; vinyl ethers such as an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethyleneglycol vinyl ether, dimethylaminoethyl vinyl ether, diethylaminoethyl vinyl ether, butylaminoethyl vinyl ether, phenoxyethyl vinyl ether, tetrahydrofurfuryl vinyl ether, etc.), a vinyl aryl ether (e.g., vinyl phenyl ether, vinyl tolyl ether, vinyl chlorophenyl ether, vinyl 2,4-dichlorophenyl ether, vinyl naphthyl ether, vinyl anthranyl ether, etc.); vinyl esters such as vinyl acetate, vinyl propionate, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenyl acetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, vinyl naphthoate, etc.; N-vinyl compounds such as N-vinyloxazolidone, N-vinylimidzole, methylvinylimidazole, N-vinylpyrrolidone, N-vinylcarbazole, N-vinylethylacetamide, etc.; styrenes such as styrene, an alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, etc.), an alkoxystyrene (e.g., methoxystyrene, 4-methoxy-3-methylstyrene, dimethoxystyrene, etc.), a halostyrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, etc.), a carboxystyrene (e.g., vinylbenzoic acid, methyl vinylbenzoate, etc.); crotonic acid esters such as an alkyl crotonate (e.g., butyl crotonate, hexyl crotonate, glycerine monocrotonate, etc.); vinyl chloride; vinylidene chloride; acrylonitrile; methacrylonitrile, an olefin (e.g., ethylene, propylene, butadiene, isoprene, diisobutylene, chloroprene, dicyclopentadiene, octene-1, etc.), maleic anhydride, and the like. Of these comonomers (e.g., styrene → vinyl ether, and the like) are preferred. Copolymers containing 0 to 90 mol % of monomer units derived from these comonomers are effective.

Suitable materials for quaternizing are, halides or sulfonic esters having an unsaturated group. As the specific examples thereof, there are, e.g., halides having an unsaturated group (e.g., a halogen atom such as a chlorine atom, bromine atom or iodine atom) such as: (1) allyl halide, (2) cinnamyl halide, (3) crotyl halide, (4) vinylbenzyl halide, (5) halogenated alkyl methacrylate, (6) halogenated alkyl acrylate, (7) halogenated alkyl vinyl ether, (8) halogenated methylchalcone, (9)

halogenated alkyl methylcinnamate and (10) halogenated alkyl cinnamate, and sulfonic esters having an unsaturated group such as: (1) allyl toluenesulfonate, (2) allyl benzenesulfonate, (3) vinylbenzyl toluenesulfonate, (4) cinnamyl benzenesulfonate, (5) methacryloxyalkylbenzenesulfonate, and (6) acryloxyalkyltoluenesulfonate.

Suitable examples of unsaturated groups containing halides or sulfonates are as follows;

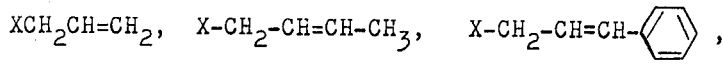 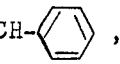

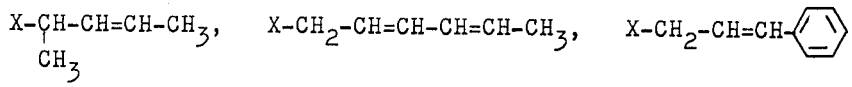 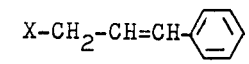

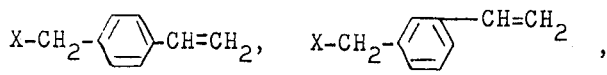

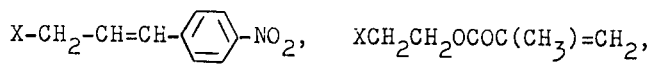

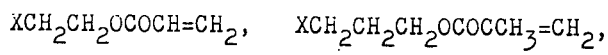

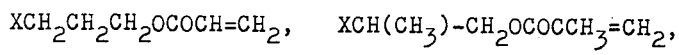

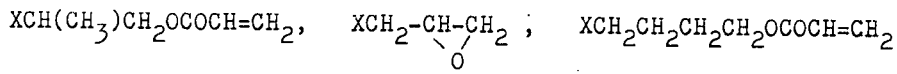

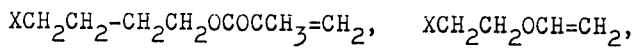

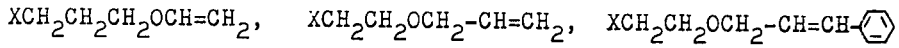

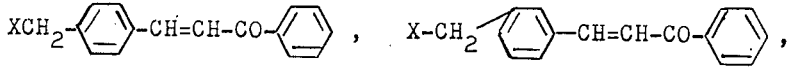

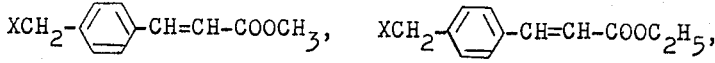

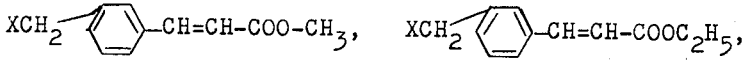

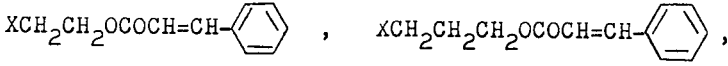

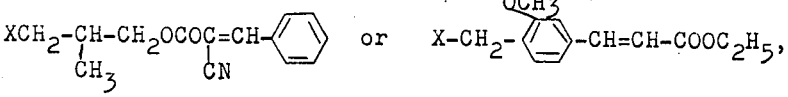

wherein X represents a halogen atom such as bromine, chlorine or iodine, an alkanesulfonyloxy group having 1 to 4 carbon atoms, an alkylsulfonyloxy group having 1 to 4 carbon atoms, a styrene-sulfonyloxy group or an arylsulfonyloxy group having 6 to 10 carbon atoms.

These compounds can be used alone or, if desired, in combination.

Polyfunctional halides or sulfonates can be used in combination with a monofunctional halide or sulfonate optionally, to decrease water solubility or to control the degree of swelling by solvents.

Examples of polyfunctional halides or sulfonates are dibromohexane, xylylenedibromide, diethyleneglycolditosylate, cyclohexanedimethanolditosylate, tribromoethylphosphite, tribromopropane, dibromopropyltosylate, tetrachloropropane, and ethylsorbatetetrabromide.

The above-described reaction (1) proceeds with ease and the reaction conditions are not particularly limited. For example, the reaction can be conducted under the following conditions. That is, a vinylpyridine is reacted with a halide or a sulfonic ester having an unsaturated group in a solvent or in the absence of a solvent or in a non-solvent such as water or an organic solvent (e.g., alcoholic solvent such as methanol or ethanol, dimethylformamide, dimethylsulfoxide, nitromethane, etc.). a suitable reactant concentration can range from about 0.1 mole/liter to 10 mole/liter preferably more than 0.5 moles/liter where a reaction medium is used. Preferably the reaction is conducted substantially in the absence of a solvent. A suitable molar ratio of the vinyl pyridine to the halide or sulfonate employed ranges from 10 to 1 to 1 to 10, preferably 2 to 1 to 1 to 5. The reaction can be conducted easily without the use of a catalyst, but iodide may be additionally useful in an amount of 0.001 to 1 wt% to the weight of the vinylpyridine. The reaction proceeds exothemally and is usually conducted at a temperature of 0° to 150°C, preferably 20° to 70°C for about 1 minute to about 10 days, preferably 2 minutes to 3 hours. Thereafter, the reaction solution is poured into a solvent, in which the produced quaternary salt-type polymer is insoluble, (such as dioxane, n-hexane, diethyl ether or a mixture thereof). If desired, the polymer produced can be isolated by filtering out the precipitate formed.

In the case of reacting the unsaturated compound with a polymer containing pyridine rings according to process (2), the reaction can be conducted, in general, under conditions as follows. The high polymer compound containing pyridine rings (i.e., containing repeating units of the formula IV) is reacted with the unsaturated compound (II) in an organic solvent (e.g., an alcoholic solvent such as methanol or ethanol, methyl ethyl ketone, nitromethane, etc.) at a temperature of about 0°C to 150°C, preferably 0°C to 80°C for about 10 minutes to 10 days, preferably 0.5 to 6 hours. A suitable molar ratio of the polymer to the unsaturated compound ranges from about 10 (per vinyl pyridine unit) to 1 to 1 to 50, preferably 2 to 1 to 1 to 5, and a suitable concentration of reactants is at least 0.01 mole/liter, preferably 0.1 moles/liter. The produced quaternary salt-type polymer can be isolated by pouring the reaction solution into a solvent, in which the quaternary salt-type polymer is insoluble, such as dioxane, hexane, diethyl ether, etc. followed by filtering out the precipitate formed.

Of the above-described polymers, those having the following repeating units are advantageous since the reaction proceeds smoothly.

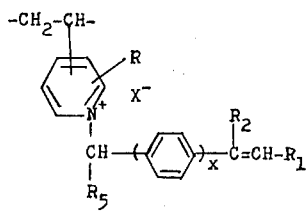

or

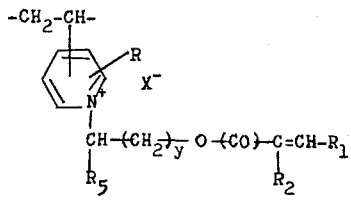

wherein R, $R_1$, $R_2$, $R_5$, x and y are as above defined.

The viscosity of the polymer can widely be changed by selecting the reaction conditions or the starting polymer. For example, polymers having an intrinsic viscosity, $[\eta]$, of 0.02 to 2.5, preferably 0.05 to 1.5 (measured at 30°C in ethanol or dimethylformamide) are suitable for use.

The degree of the quaternary unit content can be controlled by selecting the amount of the reagent to be reacted, and can widely be changed with ease depending upon the end-use purpose. However, a content of 0.001 to 100 mol %, particularly 0.05 to 100 mol %, is effective.

The synthesis will now be illustrated in greater detail by reference to the following synthesis examples, in which $[\eta]$ is the intrinsic viscosity measured at 30°C in ethanol. Unless otherwise indicated, in all of the examples given herein, parts, percents, ratios and the like are by weight.

SYNTHESIS EXAMPLE 1

Synthesis of Poly-4-vinyl-N-allylpyridinium Bromide 31.5 Grams of 4-vinylpyridine (0.3 mole) was dissolved in 100 ml of 99.5% ethanol. Then, 36.3 g of allyl bromide (0.3 mole) was added dropwise thereto and the resulting mixture was stirred at 20°C for 2 hours. A gradual increase in the viscosity of the reaction system was observed. After about 2 hours, the resulting reaction mixture was poured into 3 liters of dioxane to isolate the product. After conducting reprecipitation, the product was filtered, washed with dioxane and dried. The thus obtained polymer was a colorless powder. The yield obtained was 68%. The resulting powder was soluble in water, methanol, ethanol, dimethylsulfoxide, etc. and insoluble in dioxane, acetone, benzene, etc. It had an intrinsic viscosity, $[\eta]$, of 0.24. As a result of NMR measurement ($D_2O$ solution), absorptions were observed at $\tau$ =4.0, 4.3 and 4.8, as well as the absorptions of methylene and methine hydrogens in the polymer main chain ($\tau$=7.9) and pyridine ring hydrogens ($\tau$= 1.3 and 2.2). The above-described absorptions support the presence of allyl group hydrogen.

SYNTHESIS EXAMPLE 2

Synthesis of Poly-4-vinyl-N-allylpyridinium Bromide

The polymer was obtained in the same manner as described in Synthesis Example 1 except for using water as the reaction solvent. The yield obtained was 89%. The intrinsic viscosity, $[\eta]$, of the resulting polymer was 0.11.

SYNTHESIS EXAMPLE 3

Synthesis of Poly-4-vinyl-N-cinnamylpyridinium Chloride

4-Vinylpyridine (0.3 mole) and cinnamyl chloride (0.3 mole) were reacted with each other at 50°C for 2 hours using the same procedures as described in Synthesis Example 1. Thus, a colorless polymer powder was obtained in 70% yield. The intrinsic viscosity, $[\eta]$, of the resulting polymer was 0.11.

SYNTHESIS EXAMPLE 4

Synthesis of Poly-4-vinyl-N-(4'-vinylbenzyl)-pyridinium Chloride

4-Vinylpyridine (0.3 mole) and p-chloromethylstyrene (0.3 mole) were reacted with each other at 50°C for 2 hours according to the same procedures as described in Synthesis Example 1. Thus, a colorless powder polymer was obtained in 47% yield. The intrinsic viscosity, $[\eta]$, of the resulting polymer was 0.13.

SYNTHESIS EXAMPLE 5

Synthesis of Poly-4-vinyl-N-allylpyridinium Bromide

10 Grams of poly-4-vinylpyridine ($[\eta]$= 0.46) was dissolved in 200 ml of 99.5% ethanol. Then, 100 g of allyl bromide was added dropwise thereto, and the stirring was continued for 2 hours at 20°C. A gradual increase in viscosity was observed. The resulting viscous solution was poured into 2 liters of dioxane and reprecipitation was conducted.

The thus obtained precipitate was washed with dioxane, filtered and dried. Thus, 19.7 g (ratio of the formation of quaternary salts: 84%) of colorless powder, which was soluble in water, methanol and ethanol but insoluble in dioxane, acetone and benzene, was obtained. The intrinsic viscosity, [η], of the resulting polymer was 1.42. As a result of NMR measurement ($D_2O$ solution), absorptions were observed at =4.0, 4.3 and 4.8, as well as the absorptions of methylene and methine hydrogens in the polymer main chain (τ=around 8.0) and pyridine ring hydrogens (τ=1.4 and 2.4). The above-described absorptions are believed to correspond to the allyl group hydrogens.

SYNTHESIS EXAMPLE 6

Synthesis of Poly-2-vinyl-N-allylpyridinium Bromide

10 Grams of poly-2-vinylpyridine ([η] = 0.14) was dissolved in 180 ml of nitromethane. Then, 100 g of allyl bromide was added dropwise thereto, and stirring was continued for 6 hours at 50°C. After about 3 hours of reaction, a precipitate began to be formed. After 3 hours, the precipitate formed was separated, dissolved in 200 ml of ethanol and poured into 2 liters of dioxane to conduct reprecipitation. The resulting precipitate was washed with dioxane, filtred and dried. Thus, 15.0 g of a colorless powder (ratio of the formation of quaternary salts: 43%), which was soluble in water, methanol and ethanol but insoluble in dioxane, was obtained. The intrinsic viscosity, [η], of the resulting polymer was 0.31.

SYNTHESIS EXAMPLE 7

Synthesis of Poly-2-methyl-5-vinyl-N-allylpyridinium Bromide

In the same manner as described in Synthesis Example 5, a colorless powder (ratio of the formation of quaternary salts: 76%) was obtained by conducting the reaction at 50°C for 2 hours using 10 g of poly-2-methyl-5-vinylpyridine ([η]=0.32), 98 g of allylbromide in 200 ml of ethanol. The resulting product was soluble in water, methanol and ethanol but insoluble in dioxane. The intrinsic viscosity, [η], of the product was 0.73.

SYNTHESIS EXAMPLE 8

Synthesis of Poly-4-vinyl-N-cinnamylpyridinium Chloride

In the same manner as described in Synthesis Example 5, a colorless powder (ratio of the introduction of quaternary salts: 51%) was obtained by reacting 10 g of poly-4-vinylpyridine and 130 g of cinnamyl chloride in 200 ml of ethanol at 60°C for 3 hours. The resulting product was soluble in water, methanol and ethanol but insoluble in dioxane, acetone and benzene. The intrinsic viscosity, [η], of the product was 0.52.

SYNTHESIS EXAMPLE 9

Synthesis of Poly-4-vinyl-N-crotylpyridinium Bromide

In the same manner as described in Synthesis Example 5, a colorless powder (ratio of the introduction of quaternary salts: 88%) was obtained by reacting 10 g of poly-4-vinylpyridine with 100 g of crotyl bromide in 200 ml of ethanol at room temperature (about 20° – 30°C) for 2 hours. The resulting product was soluble in water, methanol, and ethanol, but insoluble in dioxane, acetone and benzene. The intrinsic viscosity, [η], of the product was 1.18.

SYNTHESIS EXAMPLE 10

Synthesis of Poly-4-vinyl-N-(4'-vinylbenzyl)pyridinium Chloride

In the same manner as described in Synthesis Example 5, a colorless powder (ratio of the introduction of quaternary salts: 32%) was obtained by reacting 10 g of poly-4-vinylpyridine and 56 g of p-chloromethylstyrene in 200 ml of ethanol at 50°C for 2 hours. The resulting product was soluble in hot water, methanol and ethanol, but insoluble in dioxane, acetone and benzene. The intrinsic viscosity, [η], of the product was 1.66.

SYNTHESIS EXAMPLE 11

In a 25 ml round bottomed flask equipped with a stirrer was added 6.3 g of 4-vinylpyridine and 3.63 g of allyl bromide was added to this over a three minute period. As soon as the addition was begun under stirring, a vigorous exothermic reaction began and a transparent faintly reddish semisolid was obtained in a quantitative yield. The resulting polymer was soluble in water, methanol or ethanol.

The quaternary salt-type polymer of the present invention having unsaturated bonds undergoes a reduction in solubility or becomes insoluble due to the action of light, electron beams and in general, electromagnetic waves, particle rays, thermal radiation, etc. A suitable wave length ranges $10^{-2}$ to $10^6$ mμ and enables the formation of images by development-processing with water or an aqueous solvent. The reaction mechanism of this photoinsolubilization of the polymer having unsaturated bonds is not completely clear in detail, but a cross-linking reaction due to chain transfer reaction is believed to take place.

While the quaternary salt-type reactive polymer of the present invention undergoes a reduction in solubility or becomes insoluble due to the action of light or electron beams without the presence of any additives, it is possible to shorten the irradiation time and to produce the desired difference in physical property by adding, as a sensitizing agent an aromatic carbonyl compound, an aromatic nitro compound, an aromatic quinone, a triphenyl methane, an anthrone, a nitroaniline, an acylated nitroaniline, a thiazole, a ketone, pyrylium dye salts, thiapyrylium dye salts, benzothiazolines, naphthothiazolines, quinolizones, acrydones, cyanine dyes, dithiolium salts, α-ketoaldonyl compounds, diazoles, triazoles, oxazoles, and various photographic sensitizing dyes.

Specific examples of such useful sensitizing compounds are nitro compounds such as p-nitrodiphenyl, 5-nitro-2-aminotoluene 4-nitro-1-aminonaphthalene, 4-nitro-1-acetylaminonaphthalene, picric acid, picramide, dichloronitroanilene, nitroacenaphthene, dinitronaphthalene, trinitrofluorenone, tetranitrocarbazole, dinitrobenzoanthrazenedione, dinitrodimethylacetyl-tert-butylbenzene, dinitrostilbene disulfonic acid, trinitronaphthalene, and dinitrochalcone, carbonyl compounds such as benzanthrone, 9-anthraldehyde, acetonaphthone, xanthone, benzophenone, phenan threnquinone, benzanthraquinone, t-butylanthraquinone, chloroanthraquinone, anthraquinone, naphthoquinone, benzophenone, furanone, 2,6-bis-p-azidobenzal-4-methyl-cyclohexanone, benzoin, pivaloin, 2-methoxy-2-phenylacetophenone, 2-ethoxy-2-phenyl acetophenone, α-methylbenzoin, α-hexylbenzoin, α-allylbenzoin, α-tolylbenzoin, benzoylmethylene-N-ethyl-β-naphthothiazoline, tetramethylaminobenzophenone, tetraethylaminobenzophenone, dimethoxybenzophenone, dimethoxythiobenzophenone, 1-cyano-2-keto-3-methyl-6-bromo-3-azabenzanthrone, 1-carboethoxy-2-keto-3,4-diazabenzanthrone, 2-keto-3-methyl-1,3-diazabenzanthrone, diphthaloylnaphthalene, 2-benzoylmethylene-1-β-naphtothiazoline, 4-H-quinolizine-4-thione, tetramethylaminothiobenzophenone, thiobenzophenone, erythrosine, 6-dimethylamino-4-methyl-coumarin, 2-benzoylmethylene-1-methyl-benzothiazoline, 2-nitrophthaloylmethylene-1-ethyl-benzothiazoline, dimethylcarbamoylmethyleneethylbenzothiazoline, diethylcarbamoylmethyleneethylbenzothiazoline, 2-benzoylmethylene-3-ethylnaphtho-[1,2-d]-thiazoline, 2,5-bis-(4-dimethylaminophenyl)oxidazole, α-(4-dimethylaminophenyl)-phenanthio-(9,10)-4,5-oxazole, 2-)p-cyanobenzoylmethylene)-3-ethylnaphtho-[1,3-d]-thiazoline, 3-ethyl-2-[p-(trifluoromethyl)-benzoylmethylene]-naphtho[1,2-d]thiazoline, 5-chloro-2-(p-cyano-benzoylmethylene)-3-ethyl benzothiazole, methyl-3-ethyl-2-benzothiazolinylidene dithioacetate, 2,6-di(p-ethoxyphenyl)-4-(p-n-amyloxyphenyl)-thiapyrylium perchorate, 2,4,6-triphenyl-pyrylium perchlorate, 4-(4-methoxyphenyl)-2,6-diphenylpyrylium perchlorate, 4-(2,4-dichlorophenyl)-2,6-diphenylpyrylium perchlorate, 2,6-bis(4-methoxyphenyl)-4-phenylpyrylium perchlorate, 6-(4-methoxyphenyl)-2,4-diphenylpyrylium perchlorate, 2-(3,4-dichlorophenyl)-4-(4-methoxyphenyl)-6-phenylpyrylium perchlorate, 4-(4-amyloxyphenyl)-2,6-bis(4-ethyl phenyl)pyrylium perchlorate, (pyrylium salts) and dyes such as methyl violet, victoria blue, and malachite green (triphenylmethane dyes), diethyldibenzothiacyanine iodide, diethyldibenzothiacarbocyanine bromide, and dimethyldibenzothiacyanine iodide (cyanine, thiocyanine dyes), are also useful.

Of these sensitizers, the carbonyl compounds and nitro compounds show good sensitizing effect and these compound are very convenient to use since they are commercially available. Some of these compounds are described in U.S. Pats. Nos. 2,610,120; 2,670,285; 2,670,285; 2,670,287; 2,690,966; 2,732,301; 2,811,443; 2,835,656; 2,956,878; 3,023,100; 3,066,117; 3,173,787; 3,357,831; 3,409,593; 3,418,295; 3,453,110; 3,475,617; 3,561,969; 3,575,929; 3,582,327; 3,647,470; 3,721,566; and 3,737,319; British Pat. No. 659,197; French Pats. Nos. 1,086,257; 1,089,290; and 1,238,262; and in the literature such as J. Kosar *Light Sensitive Systems* John Wiley and Sons, New York 1965.

A suitable amount of the sensitizing agent to be added is, in general, 0.01 to 20.0% by weight based on the reactive polymer. In addition, a light-sensitive film can be formed by adding to the light-sensitive polymer, if desired, conventional additives such as a stabilizing agent, an antioxidant, a preservative, a plasticizer, a dye, a pigment, etc. in suitable amounts and applying the mixture as a solution to a suitable support such as aluminum, polyester film, polyolefin film, glass, zinc, a semiconductor wafer, paper or metal. Examples of such antioxidants and preservatives are hydroquinone monoether, naphthol, polyalkyl phenol, etc., and illustrative specific examples are hydroquinone benzyl ether, trimethyl phenol, dibutyl cresol, copper phthalocyanine, propyl gallate, hydroquinone lauryl ether, phloroglucine, 5-methylresorcinol, thiourea, phenylthiourea, t-octylhydroquinone, copper resinate, cuprouschloride, phenyl naphthylamine, phenothiazine, p-toluquinone, dinitrobenzene, tetramethoxybenzophenone, dihydroxybenzophenone, as well as those described in U.S. Pats. Nos. 2,651,584 and 2,656,271.

It is preferable to use the thermal polymerization inhibitor in an amount of about 0.01 to 5 percent by weight to the functional polymer, which is substantially effective in the combination with the amount of the sensitizer.

Examples of pigments and dyes are materials such as titanium dioxide, zinc oxide, antimony trioxide, aluminum oxide, zirconium oxide, titanium oxide phosphate, titanium sulfate, barium sulfate, calcium oxide, glass beads, magnetic compounds such as iron oxide, chromium oxide, cobalt oxide or alloys of these, carbon black, vinyl monomer graft carbon black, polyacetylene, phthalocyanine, phthalocyanine blue, methylene blue. Crystal Violet, pigment yellow, quinacridone, quinacridone sulfoneamide, Rhodamine B, Fuchsine, Auramine, anthraquinone dyes such as dimesidinoanthraquinone, photoconductive compounds fluorescent dyes and others as described in U.S. Pats. Nos. 3,740,219; 3,752,668; 3,752,666; 3,753,708; and 3,754,919.

Suitable plasticizers which can be used to modify the thermo-mechanical properties of the coating composition are esters such as phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, diaryl phthalate, etc.; glycol esters such as dimethyl glycol phthalate, ethylphthalylethyl glycol, methylphthalylethyl glycol, butylphthalylbutyl glycol, triethylene glycol dicapryl ester, etc.; phosphoric acid esters such as tricresyl phosphate, triphenyl phosphate, etc.; aliphatic dibasic acid esters such as diisobutyl adipate, dioctyl adipate, dimethyl sebacate, dubutyl sebacate, dioctyl sebacate, dibutyl maleate, etc.; and other materials such as triethyl citrate, glycerine triacetyl ester, and butyl laurate.

Suitable coating methods are flow coating, roll coating, spray coating, boiler coating, dip coating or the like. The thickness of the coating solution film is not particularly limited but, in general, a thickness of 0.2 μ to 120 μ is employed, which, however, can be increased or decreased if desired.

Image formation, which is one use of the composition of the present invention will now be illustrated in greater detail by reference to the following non-limiting examples which, however, are not intended to be construed as limiting the use of the composition of the present invention in any way.

USE EXAMPLE 1

1 Gram of the quaternary salt-type polymer obtained in Synthesis Example 1 was dissolved in 20 ml of methanol, and the resulting solution was applied to a sandblasted aluminum plate in a dry thickness of about 10 microns. The thus prepared light-sensitive plate was imagewise exposed for 60 minutes to a 450 W high pressure mercury lamp spaced at a distance of 30 cm through a transparent line original. Upon rinsing the light-sensitive plate in water at 20°C, the unexposed area was dissolved away to form a distinct image.

USE EXAMPLE 2

1 Gram of the quaternary salt-type polymer obtained in Synthesis Example 1 and 50 mg of Michler's ketone were dissolved in a mixed solvent of 10 ml of methanol and 10 ml of chloroform, and a light-sensitive plate was prepared in the same manner as discribed in Use Example 1. The thus prepared light-sensitive plate was exposed for 1 minute in the same manner as described in Use Example 1. Upon rinsing in a mixed solvent of methanolchloroform (1:1 by volume ratio), a distinct image was obtained.

USE EXAMPLE 3

The quaternary salt-type polymer obtained in Synthesis Example 2 was used and the procedures employed in Use Example 2 for the preparation of the light-sensitive element were repeated. Exposure was conducted for 1 minute in the same manner as described in Use Example 2. Upon development, a distinct image was obtained.

USE EXAMPLE 4

The quaternary salt-type polymer obtained in Synthesis Example 3 was used and the procedures employed in Use Example 2 for the preparation of the light-sensitive element were repeated. Exposure was conducted for 20 minutes in the same manner as described in Use Example 2. Upon development, a distinct image was also obtained.

USE EXAMPLE 5

The quaternary salt-type polymer obtained in Synthesis Example 4 was used and the procedures employed in Use Example 2 for the preparation of the light-sensitive element were repeated. Exposure was conducted for 10 seconds. Upon development, a distinct image was obtained. When nitroacenaphthene or phenanthraquinone was used in place of the Michler's ketone, satisfactory results were obtained likewise.

USE EXAMPLE 6

In this example, the difference between the reactivity of the polymer obtained in Synthesis Example 4 and that of the polymer obtained in Synthesis Example 10 are shown.

The procedures were conducted under the same conditions as in Use Example 1 except for exposing for 30 minutes and using an optical wedge in place of the line original. The optical wedge used had a step difference of 0.11 to 0.16.

With the light-sensitive plate using the polymer obtained in Synthesis Example 4, hardening occurred up to 8th step, while, with the light sensitive plate using the polymer obtained in Synthesis Example 10, hardening occurred up to only 6th step. The difference by 2 steps shows that the former possesses a sensitivity about 2 times that of the latter.

USE EXAMPLE 7

This example shows the use of a thermosetting reaction. The same coated material as in Use Example 1 was prepared using the polymer obtained in Synthesis Example 4. This was then brought into contact with a submerged-type heater for 1 minute. (As the submerged-type heater, a usual, commercially available heater was used which had an out put of 500 W and was covered with glass at the heating portion thereof.) Then, when the material was rinsed in a methanol-chloroform mixed solvent, it was found that hardening reaction had occurred only at the heated area thereof.

USE EXAMPLE 8

1 Gram of the quaternary salt-type polymer obtained in Synthesis Example 5 was dissolved in 20 ml of methanol, and the resulting solution was applied to a grained aluminum plate in a dry thickness of about 10 microns. The thus prepared light-sensitive plate was imagewise exposed for 20 minutes to a 450 W high pressure mercury lamp spaced at a distance of 30 cm through a transparent line original. Upon rinsing the light-sensitive plate in water, the unexposed area was dissolved away to form a distinct image.

USE EXAMPLE 9

1 Gram of the quaternary salt-type polymer obtained in Synthesis Example 5 and 50 mg of MIchler's ketone were dissolved in a mixed solvent of 10 ml of methanol and 10 ml of chloroform, and a light-sensitive plate was prepared in the same manner as described in Use Example 1. The thus prepared light-sensitive plate was exposed for 10 seconds in the same manner as described in Use Example 1. Upon rinsing in a methanol-chloroform mixed solvent (1:1 in volume ratio), a distinct image was obtained.

USE EXAMPLE 10

The procedures described in Use Example 9 were conducted except for using p,p'-tetraethyldiaminobenzophenone in place of Michler's ketone and exposing for 20 seconds. Thus, a distinct image was obtained.

USE EXAMPLE 11

The quaternary salt-type polymer obtained in Synthesis Example 6 was used. The preparation of the light-sensitive element was done in accordance with the procedures of Use Example 2. Exposure was conducted for 10 minutes in the same manner as described in Use Example 2. Upon development, a distinct image was obtained.

USE EXAMPLE 12

The quaternary salt-type polymer obtained in Synthesis Example 7 was used. The preparation of the light-sensitive element was done in accordance with the procedures of Use Example 2. Exposure was conducted for 20 seconds in the same manner as described in Use Example 9. Upon development, a distinct image was obtained.

USE EXAMPLE 13

The quaternary salt-type polymer obtained in Synthesis Example 8 was used. The preparation of the light-sensitive element was done in accordance with the procedures of Use Example 2. Exposure was conducted for 60 minutes in the same manner as described in Use Example 8. Upon development, a distinct image was obtained.

USE EXAMPLE 14

The quaternary salt-type polymer obtained in Synthesis Example 8 was used. The preparation of the light-sensitive element was done in accordance with the procedures of Use Example 2. Exposure was conducted for 30 minutes in the same manner as described in Use Example 10. Upon development, a distinct image was

17 obtained.

USE EXAMPLE 15

The quaternary salt-type polymer obtained in Synthesis Example 8 was used together with 2,4,7-trinitrofluorenone and the procedures of Use Example 2 were employed to prepare the light-sensitive element. Exposure was conducted for 30 minutes in the same manner as described in Use Example 9. Upon development, a distinct image was obtained.

USE EXAMPLE 16

The quaternary salt-type polymer obtained in Synthesis Example 9 was used. The preparation of the light-sensitive element was done in accordance with the procedures of Use Example 2. Exposure was conducted for 20 minutes in the same manner as described in Use Example 9. Upon development, a distinct image was obtained.

USE EXAMPLE 17

The quaternary salt-type polymer obtained in Synthesis Example 10 was used. The preparation of the light-sensitive element was done in accordance with the procedures of Use Example 2. Exposure was conducted for 45 minutes in the same manner as described in Use Example 8. Upon development with hot water, a distinct image was obtained.

USE EXAMPLE 18

The quaternary salt-type polymer obtained in Synthesis Example 10 was used. The preparation of the light-sensitive element was done in accordance with the procedures of Use Example 2. Exposure was conducted for 20 seconds in the same manner as described in Use Example 9. Upon development, a distinct image was obtained.

While the invention has been described in detail and with reference to specific embodiments thereof, it will be apparent to one skilled in the art that various changes and modifications can be made therein without departing from the spirit and scope thereof.

What is claimed is:

1. A reactive photosensitive composition consisting essentially of a reactive polymer produced by the reaction of a homopolymer or copolymer of vinyl pyridine or a substituted vinyl pyridine with a compound of the formula

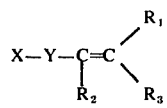

or by the reaction of a monomer of the formula

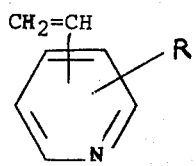

with a compound of the formula

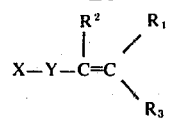

, which reactive polymer contains repeating units of the formula:

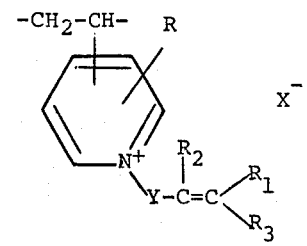

wherein
R represents a hydrogen atom or an alkyl group having 1 to 4 carbon atoms;
$R_1$ represents a hydrogen atom, an alkyl group having 1 to 6 carbon atoms, an alkoxycarbonyl group having 2 to 8 carbon atoms, an aryl group, a carbamoyl group having 1 to 8 carbon atoms, a carboxy group or an acyl group having 1 to 8 carbon atoms;
$R_2$ represents a hydrogen atom, a methyl group or a cyano group;
$R_3$ represents a hydrogen atom, a carbamoyl group having 1 to 8 carbon atoms, a nitro group, a cyano group, an alkoxy group having 1 to 3 carbon atoms or an alkoxycarbonyl group having 2 to 8 carbon atoms;
Y represents a divalent radical wherein -Y- is

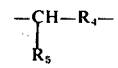

wherein $R_4$ represents

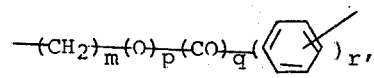

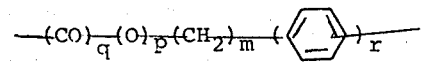

or 

wherein $m$ is 0, 1, 2 or 3; $p$, $q$ and $r$ is 0 or 1;
$R_5$ represents a hydrogen atom or a methyl group
X represents a halogen atom, an alkylsulfonyloxy group having 1 to 4 carbon atoms, a styrenesulfonyloxy group or an arylsulfonyloxy group having 6 to 10 carbon atoms.

2. A light-sensitive element comprising a support having thereon the reactive composition as claimed in claim 1.

3. A process of producing a reactive polymer comprising reacting a reaction system consisting essentially of a polymer containing repeating units of the formula

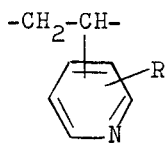

with a halide or a sulfonate of the formula

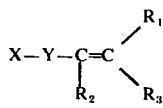

wherein X, R, R₁, R₂, R₃ and Y are as defined in claim 1.

4. The process of claim 3 wherein said reactive polymer is a copolymer with a comonomer selected from the group consisting of acrylic esters, acrylamides, methacrylic esters, methacrylamides, alkyl compounds, vinyl ethers, vinyl esters, N-vinyl compounds, styrenes and crotonic acid esters.

5. A process of producing a reactive polymer comprising reacting a monomer of the formula

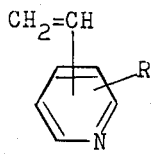

with a compound of the formula

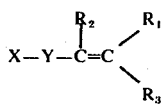

wherein R, R₁, R₂, R₃, X and Y are the same as defined in claim 1.

6. The quaternary salt reactive composition as claimed in claim 1, wherein said polymer contains 0.001 to 100 mole percent of said repeating units of said general formula.

7. The composition of claim 1 wherein said reactive polymer is a homopolymer.

8. The composition of claim 1 wherein said reactive polymer is a copolymer of said repeating units with a comonomer selected from the group consisting of acrylic esters, acrylamides, methacrylic esters, methacrylamides, alkyl compounds, vinyl ethers, vinyl esters, N-vinyl compounds, styrenes and crotonic acid esters.

9. A quaternary salt reactive polymer produced by the reaction of a homopolymer or copolymer of a vinyl pyridine or a substituted vinyl pyridine with a compound of the formula

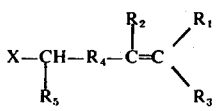

or by the reaction of a monomer of the formula

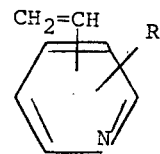

with a compound of the formula

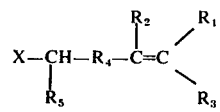

, which quaternary salt reactive polymer contains therein repeating units represented by the following general formula

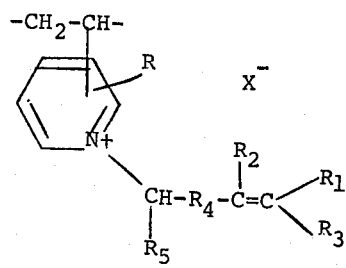

wherein
R represents a hydrogen atom or an alkyl group having 1 to 4 carbon atoms;
R₁ represents a hydrogen atom, an alkyl group having 1 to 6 carbon atoms, an alkoxycarbonyl group having 2 to 8 carbon atoms, an aryl group, a carbamoyl group having 1 to 8 carbon atoms, a carboxy group or an acyl group having 1 to 8 carbon atoms;
R₂ represents a hydrogen atom, a methyl group or a cyano group;
R₃ represents a hydrogen atom, a carbamoyl group having 1 to 8 carbon atoms, a nitro group, a cyano group, an alkoxy group having 1 to 3 carbon atoms or an alkoxy carbonyl group having 2 to 8 carbon atoms;
R₄ represents

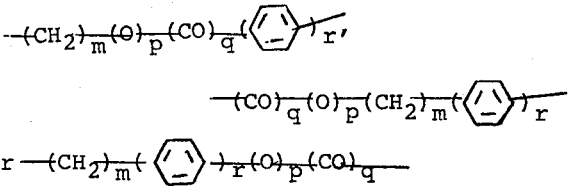

wherein m is 0, 1, 2 or 3, and p, q and r is 0 or 1;
R₅ represents a hydrogen atom or a methyl group; and X represents a benzenesulfonyloxy group, a toluenesulfonyloxy group or a styrenesulfonyloxy group.

10. A process for producing a polymer containing repeating units of the formula set forth in claim 9, which comprises reacting a vinyl pyridine monomer with an organic sulfonic acid ester containing a carbon-carbon double bond.

11. The process as claimed in claim 10, wherein said organic sulfonic acid ester is a compound represented by the following general formula

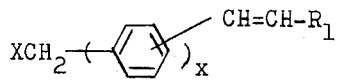

or the following general formula

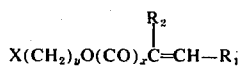

wherein $R_1$, $R_2$ and X are as defined in claim 10 and wherein $x$ is 0 or 1 and $y$ is 1, 2 or 3.

12. The process as claimed in claim 11, wherein said organic sulfonic acid ester is selected from the group consisting of wherein X represents a benzenesulfonyloxy group, a toluenesulfonyloxy group or a styrenesulfonyloxy group.

13. A process for producing a polymer containing repeating units of the general formula set forth in claim 9, which comprises reacting a polymer containing therein vinyl pyridine or vinyl alkyl pyridine monomer units with an organic halide having an unsaturated group.

14. A process for producing a polymer containing repeating units of the general formula set forth in claim 9, which comprises reacting a polymer containing therein vinyl pyridine or vinyl alkyl pyridine monomer units with an organic sulfonic acid ester containing a carbon-carbon double bond.

15. A reactive composition comprisin a reactive polymer as claimed in claim 9 and at least one sensitizing

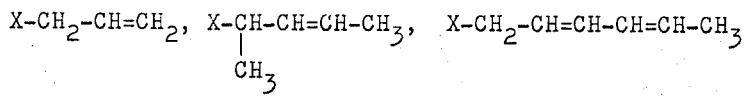

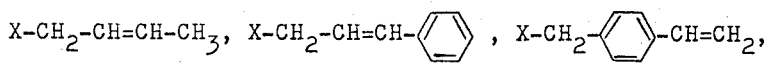

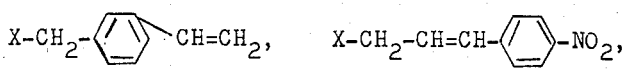

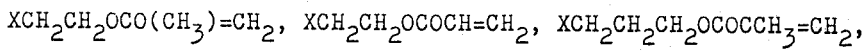

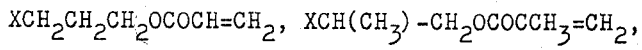

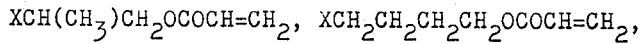

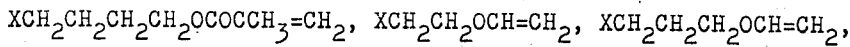

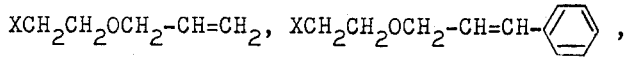

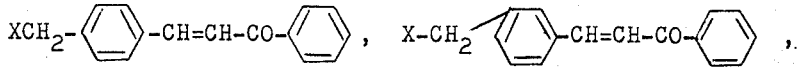

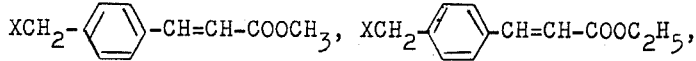

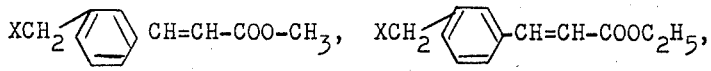

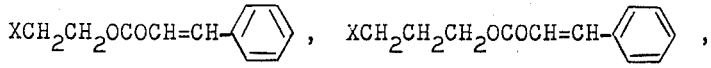

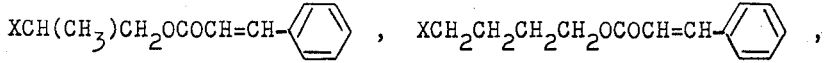

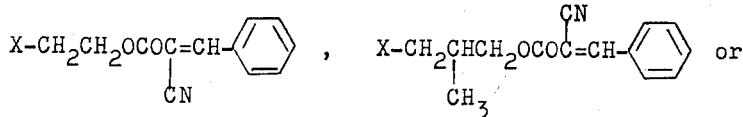

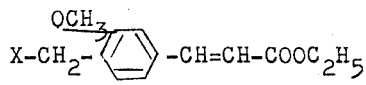

agent which sensitizes said reactive polymer to irradiation.

16. The reactive composition as claimed in claim 15, wherein the sensitizing agent is present in an amount ranging from 0.1 to 20 weight percent to said polymer.

17. The composition of claim 15 wherein said sensitizing agent is selected from the group consisting of an aromatic carbonyl compound, an aromatic nitro compound, an aromatic quinone, a triphenyl methane, an anthrone, a nitroaniline, an acylated nitroaniline, a thiazole, a ketone, pyrylium dye salts, thiapyrylium dye salts, benzothiazolines, naphthothiazolines, quinolizones, acrydones, cyanine dyes, dithiolium salts, 2-ketoaldonyl compounds, diazoles, triazoles and oxazoles.

18. The polymer of claim 9 wherein said reactive polymer is a homopolymer.

19. The polymer of claim 9 which is a copolymer of said repeating unit with a comonomer selected from the group consisting of acrylic esters, acrylamides, methacrylic esters, methacrylamides, alkyl compounds, vinyl ethers, vinyl esters, N-vinyl compounds, styrenes and crotonic acid esters.

20. A quaternary salt polymer produced by the reaction of a homopolymer or copolymer of a vinyl pyridine or a substituted vinyl pyridine with a compound of the formula

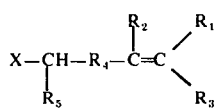

or by the reaction of a monomer of the formula

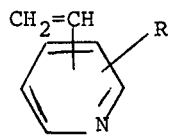

with a compound of the formula

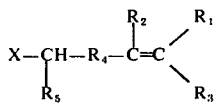

, which quaternary salt polymer contains therein repeating units represented by the following general formula

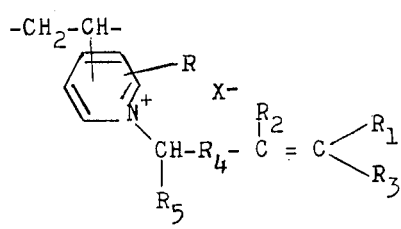

wherein the moiety

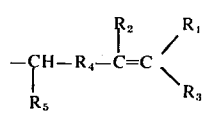

in the above general formula is derived from a compound of the general formula

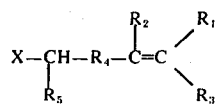

in which said compound of the general formula is

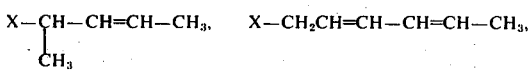

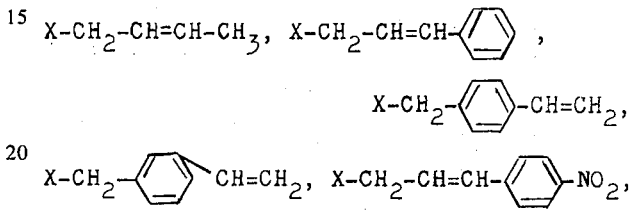

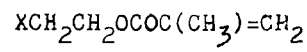

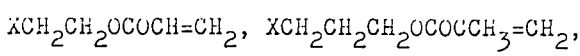

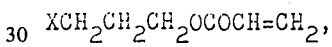

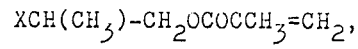

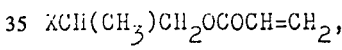

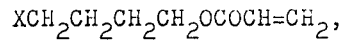

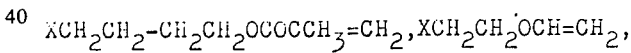

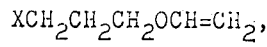

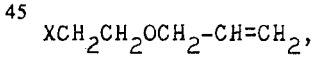

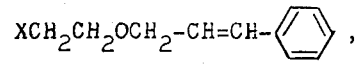

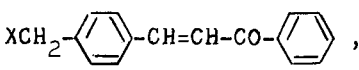

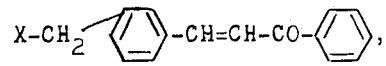

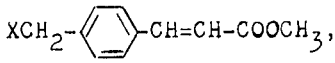

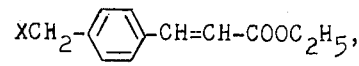

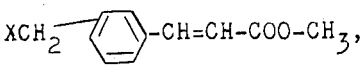

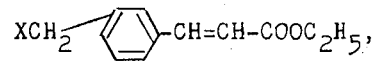

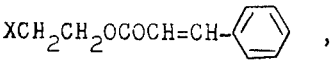

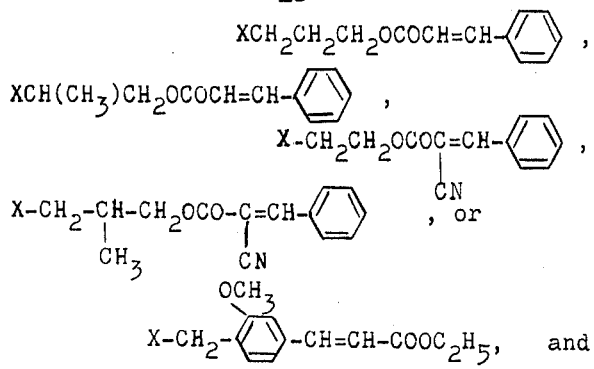

wherein X is a halogen atom, an alkylsulfonyloxy group having 1 to 4 carbon atoms, an alkenylsulfonyloxy group having 2 to 4 carbon atoms, a styrenesulfonyloxy group or an arylsulfonyloxy group having 6 to 10 carbon atoms.

21. The polymer of claim 20 which is a homopolymer.

22. The polymer of claim 20 which is a copolymer with a comonomer selected from the group consisting of acrylic esters, acrylamides, methacrylic esters, methacrylamides, alkyl compounds, vinyl ethers, vinyl esters, N-vinyl compounds, styrenes and crotonic acid esters.

* * * * *